US 9,410,796 B2

(12) United States Patent
Beerens et al.

(10) Patent No.: US 9,410,796 B2
(45) Date of Patent: Aug. 9, 2016

(54) LITHOGRAPHIC APPARATUS AND METHOD

(71) Applicant: ASML Netherlands B.V., Veldhoven (NL)

(72) Inventors: Ruud Antonius Catharina Maria Beerens, Roggel (NL); Engelbertus Antonius Fransiscus Van Der Pasch, Oirschot (NL); Johannes Petrus Martinus Bernardus Vermeulen, Helmond (NL); Theodorus Petrus Maria Cadee, Asten (NL); Raymond Wilhelmus Louis Lafarre, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 494 days.

(21) Appl. No.: 13/687,524

(22) Filed: Nov. 28, 2012

(65) Prior Publication Data
US 2013/0162966 A1 Jun. 27, 2013

Related U.S. Application Data

(60) Provisional application No. 61/579,944, filed on Dec. 23, 2011.

(51) Int. Cl.
*G03F 7/20* (2006.01)
*G01B 11/14* (2006.01)

(52) U.S. Cl.
CPC ............ *G01B 11/14* (2013.01); *G03F 7/70008* (2013.01); *G03F 7/70775* (2013.01)

(58) Field of Classification Search
CPC . G01B 11/14; G03F 7/70008; G03F 7/70775; G01D 5/00
See application file for complete search history.

(56) References Cited

U.S. PATENT DOCUMENTS

| 5,000,572 | A | * | 3/1991 | Nose et al. ................. 356/488 |
| 5,035,507 | A | * | 7/1991 | Nishioki et al. ............ 356/499 |
| 5,104,225 | A | * | 4/1992 | Masreliez ............... G01D 5/38 |
| | | | | 250/237 G |
| 5,283,434 | A | * | 2/1994 | Ishizuka et al. ........... 250/237 G |
| 5,321,502 | A | | 6/1994 | Matsumoto et al. |
| 5,666,196 | A | * | 9/1997 | Ishii et al. .................... 356/499 |

(Continued)

FOREIGN PATENT DOCUMENTS

JP 63-277925 A 11/1988
JP 63-277926 A 11/1988

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A displacement measurement system comprising at least one retro reflector and a diffraction grating. Said displacement measurement system is constructed and arranged to measure a displacement by providing a first beam of radiation to the measurement system, wherein the diffraction grating is arranged to diffract the first beam of radiation a first time to form diffracted beams. The at least one retro reflector is arranged to subsequently redirect the diffracted beams to diffract a second time on the diffraction grating. The at least one retro reflector is arranged to redirect the diffraction beams to diffract at least a third time on the diffraction grating before the diffracted beams are being recombined to form a second beam. And the displacement system is provided with a sensor configured to receive the second beam and determine the displacement from an intensity of the second beam.

17 Claims, 4 Drawing Sheets

(56) References Cited

U.S. PATENT DOCUMENTS

| | | |
|---|---|---|
| 8,274,639 B2 | 9/2012 | Shibazaki |
| 2005/0168714 A1* | 8/2005 | Renkens et al. ............... 355/53 |
| 2007/0223007 A1* | 9/2007 | Klaver et al. ................. 356/499 |
| 2008/0094594 A1* | 4/2008 | Shibazaki ...................... 355/53 |
| 2010/0081095 A1* | 4/2010 | Shibazaki ..................... 430/325 |
| 2010/0297561 A1* | 11/2010 | Beerens et al. .............. 430/322 |
| 2011/0304839 A1 | 12/2011 | Beerens et al. |

FOREIGN PATENT DOCUMENTS

| | | |
|---|---|---|
| JP | 02-266224 A | 10/1990 |
| JP | 05-272921 A | 10/1993 |
| JP | 2008-141087 A | 6/2008 |
| JP | 2011-181850 A | 9/2011 |
| JP | 2011-257394 A | 12/2011 |
| WO | WO 2009/133702 A1 | 11/2009 |

\* cited by examiner

LITHOGRAPHIC APPARATUS AND METHOD

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. In a lithographic apparatus it is important to provide a displacement measurement system with a high accuracy.

SUMMARY

It is desirable to provide an improved displacement measurement system. Accordingly there is provided a displacement measurement system comprising:

at least one retro reflector;

a diffraction grating, said displacement measurement system being constructed and arranged to measure a displacement by providing a first beam of radiation to the measurement system, wherein the diffraction grating is arranged to diffract the first beam of radiation a first time to form diffracted beams, wherein the at least one retro reflector is arranged to subsequently redirect the diffracted beams to diffract a second time on the diffraction grating;

wherein the at least one retro reflector is arranged to redirect the diffraction beams to diffract at least a third time on the diffraction grating before the diffracted beams are being recombined to form a second beam, and the displacement system is provided with a sensor configured to receive the second beam and determine the displacement from an intensity of the second beam.

According to an embodiment of the invention, there is provided a method of measuring a displacement by: providing a first beam of radiation to diffract a first time by a diffraction grating forming diffraction beams which are redirected by at least one retro reflector to diffract a second time by the diffraction grating;

redirecting the diffraction beams to diffract at least a third time on the diffraction grating, recombining the diffraction beams to form a second beam;

receiving the second beam with a sensor; and, determining the displacement from an intensity of the second beam.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
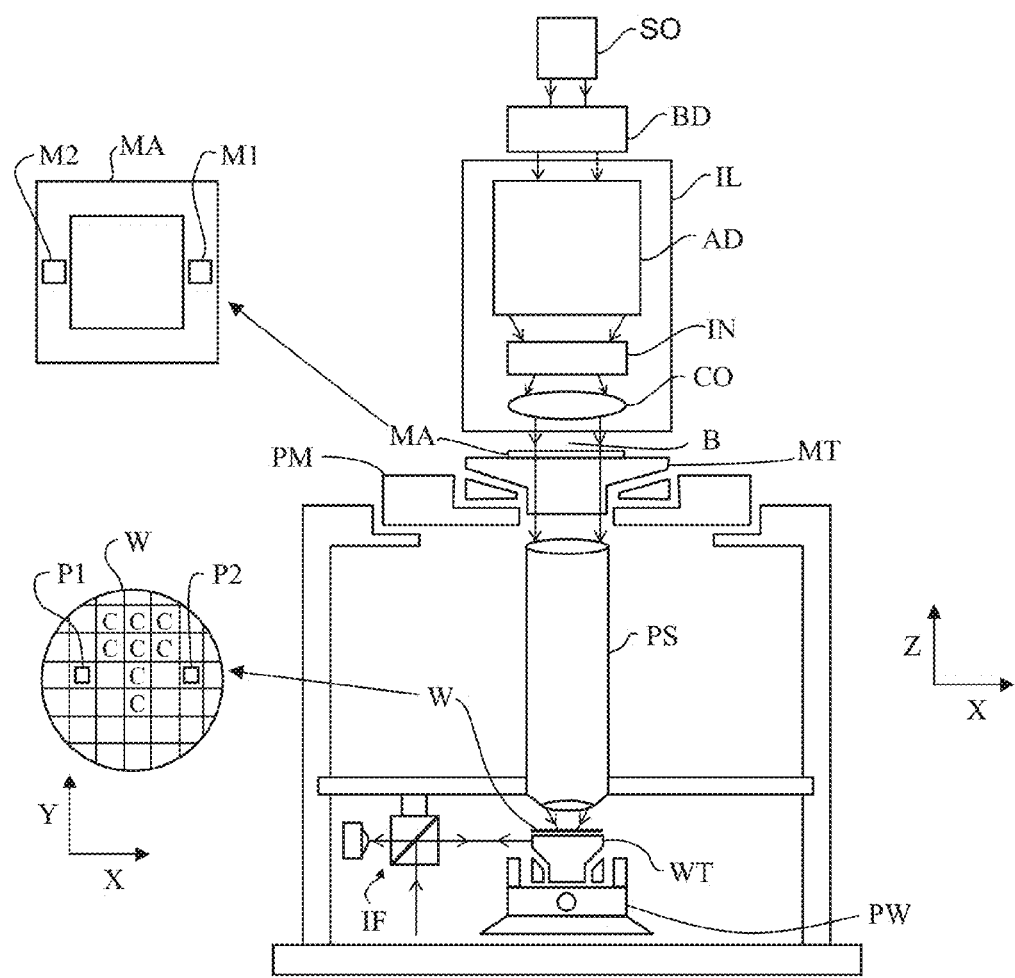
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. Note that the figures depicted are used for illustrative purposes only.

Figure 2:
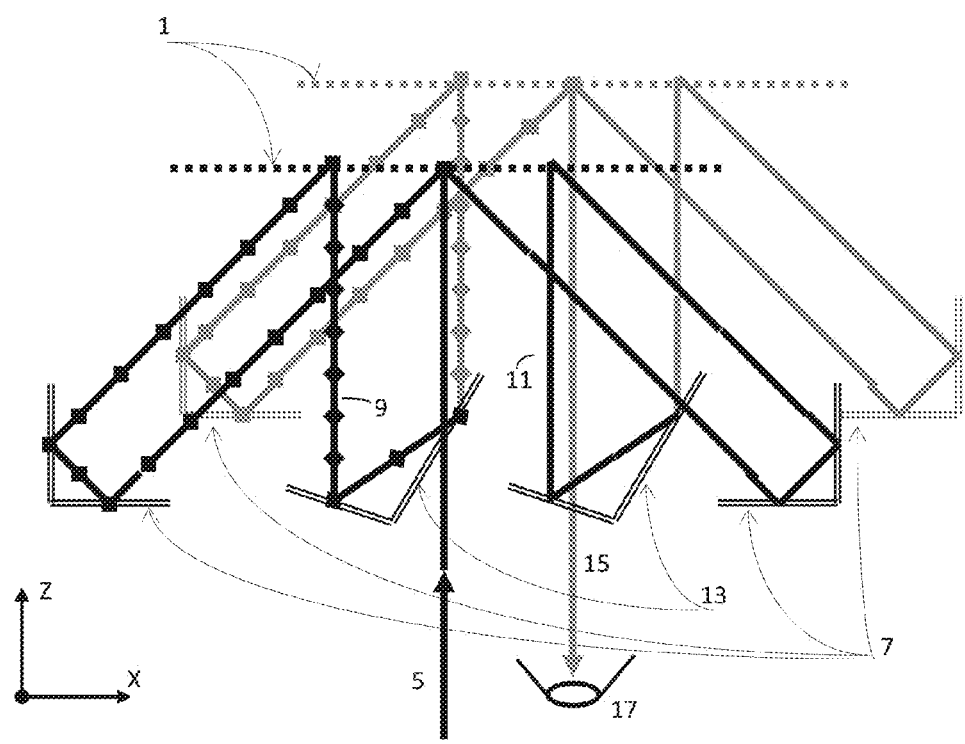
FIG. 2 depicts a displacement measurement system according to an embodiment of the invention; and, FIG. 3 depicts a top view on the passive components of a displacement measurement system according to FIG. 2.

FIG. 2 depicts a displacement measurement system according to an embodiment of the invention. The displacement measurement system comprises at least one retro reflector 7, 13 and a diffraction grating 1. The displacement measurement system is being constructed and arranged to measure a displacement by providing a first beam of radiation 5 to the measurement system. The first beam of radiation 5 may be diffracted a first time by the diffraction grating 1. The diffracted beams may be redirected by at least one retro reflector e.g., a roof top reflector 7 to diffract again by the diffraction grating 1 to form diffraction beams 9, 11. The retro reflector may be a corner cube reflector, a roof top reflector, a cats eye or another grating combined with a reflective surface. All of these have in common that they reflect the beam in the same direction as it came from.

The displacement measurement system may be provided with a retro reflector e.g., a roof top reflector 13 for redirecting the diffraction beams 9, 11 to diffract on the diffraction grating 1 for a third time increasing the accuracy of the displacement measurement system. Subsequently, the diffraction beams may be recombined to form a measurement beam as depicted in FIG. 2. Being redirected by retro reflector 7 the diffraction beams may diffract a fourth time on the first diffraction gratings 1 before being recombined to form an (inter-fering) second beam 15. Again, the retro reflector may be a corner cube reflector, a roof top reflector or a cats eye reflector. A sensor 17 with a light sensitive device, for example a photodiode, may be used to receive the second beam and determine the displacement from the intensity of the second beam 15. The displacement may be between the grating 1 and the retro reflector 7, 13, between the grating 1 and the first beam of radiation 5, or between the retro reflector 7, 13 and the first beam of radiation 5. The orientation of the optical effect of the roof top reflector 7 is substantially perpendicular to the orientation of the roof top reflector 13 so as to separate the incident radiation beam 5 from the second radiation beam 15 and to make it possible to position a sensor underneath the second beam 15.

Figure 3:
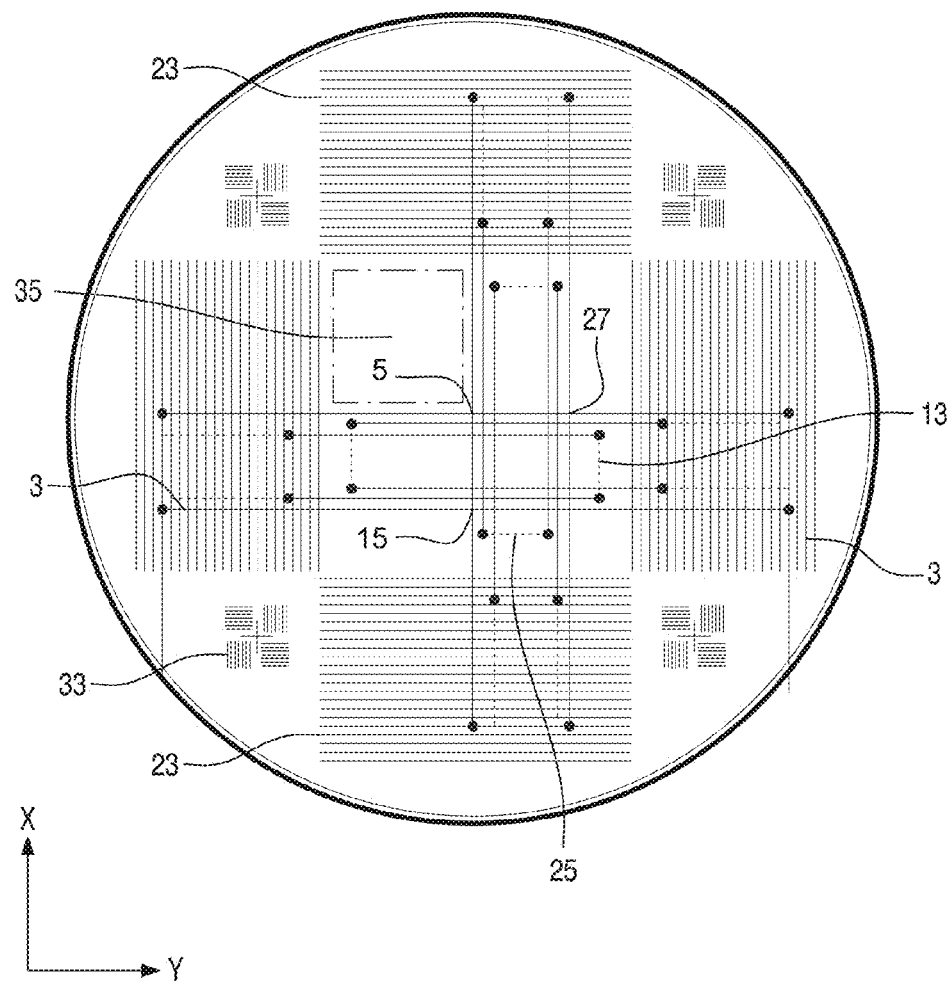

FIG. 3 depicts a top view on the components of a displacement measurement system according to FIG. 2. The first beam of radiation 5 is diffracted by the diffraction grating (1 in FIG. 2) in the Y-direction in the direction of further diffraction grating 3. The roof top reflector underneath the diffraction grating 3 redirects the diffracted beam after being diffracted by the further diffraction grating 3 again to the first diffraction grating. The roof top reflector may be any type of retro reflector, or a suitable reflective further grating. The grating 1 diffracts the diffracted beams in a direction substantially perpendicular to the XY-plane, towards the roof top reflector 13 which reflects the diffracted beam back to the diffraction grating at a slightly different X position. Again the beams are diffracted by the diffraction grating in the Y-direction towards the further grating 3. The diffracted beams are further diffracted by the further grating 3 and reflected by the roof top reflectors underneath the further gratings 3 towards the diffraction grating 1. Again the diffracted beams are diffracted in the Y-direction and finally recombined to form the second radiation beam 15, which is detected by the sensor 17 to measure a displacement in the Y-direction. For measuring in the X-direction an additional displacement system is provided. The displacement uses the same first radiation beam 5, however it may also use a separate one. The diffraction grating (not shown in FIG. 3) may be a grating diffracting a beam in the X and the Y direction, for example a checkerboard pattern. Further gratings 3 and 23 may have a checkerboard pattern as well. The first radiation beam 5 will be diffracted in the X-direction by the first diffraction grating towards the further diffraction grating 23. The roof top reflector underneath the diffraction grating 23 redirects the diffracted beam and after being diffracted by the further grating again to the diffraction grating. The diffraction grating diffracts the diffracted beam in the X-direction towards the roof top reflector 23 which reflects the diffracted beam back to the diffraction grating at a slightly different Y position. Again the beams are diffracted by the diffraction grating in the X-direction towards the further grating 3. The diffracted beams are then reflected by the roof top reflectors underneath the further grating 3 diffracted by the further grating 3 towards the diffraction grating. The diffracted beams are then again diffracted in the X-direction and recombined to form the second radiation beam 27, which is detected by the sensor to measure a displacement in the X-direction. Since in both the X and Y direction the beam is diffracted a total number of four times on the diffraction grating the precision is improved a factor of four times with respect to a situation whereby the beam is diffracted only once by the diffraction grating or a factor two compared to a situation whereby the beam is diffracted only twice by the diffraction grating. Note that a further increase of the total number of diffractions by said first grating 1 increases precision even further. As depicted in FIG. 3 the further gratings 3 and 23 may be provided in a single plane.

The passive components such as the further gratings 3 and 23, and the retro reflector e.g., roof top reflector 7, 13 (see FIG. 2) may be provided in a top module. The active components such as a radiation source (e.g., a laser or a diode) and/or the sensor of the measurement system may be provided in a bottom module. The bottom module comprising the active components may be mounted on a separate body, for example the second positioner PW such that the dissipation of heat by the active components does not influence the passive components. The passive components in the top module may, for example be mounted on the substrate table WT. The top module may be provided with alignment marks 33 for aligning the position of the module to alignment systems of the lithography apparatus. Such alignment marks 33 may be provided elsewhere on e.g., the WT as well allowing for accuracy improvement. Additional metrology tooling may be provided in area 35 of the top module. The top module may be positioned on a substrate table or a mask table and the grating may in this case be positioned stationary on a metrology frame. By placing said diffraction grating 1 and the at least one retro reflector 7, 13 at the same body, the relative displacement may be used to measure the strain in said body.

Alternatively to the embodiment disclosed in FIG. 3, the further diffractive grating 3 may be left out. In that case, the diffracted beams from the grating 1 are redirected by the roof top reflector back to the grating 1, as shown in FIG. 2. Instead of a roof top reflector, any type of retro reflector may be used.

The displacement measurement system as described above may have a grating that is a two-dimensional grating for diffracting the first beam into the diffracted beams and into further diffracted beams. The diffracted beams comprise information about the displacement in a first direction. The further diffracted beams comprise information about a displacement in a second direction, wherein the first direction is different from the second direction. For example, the grating may diffract the first beam into diffracted beams that relate to an x-measurement and into further diffracted beams that relate to a y-measurement. This way the displacement measurement system may be used to measure displacement in a plane.

The at least one retro reflector may be arranged relative to the grating to redirect the diffracted beams over paths, wherein each of the path having a similar amount of disturbances. The diffracted beams may be disturbed by temperature gradients and pressure fluctuations between the grating and the at least one retro reflector. If these disturbances are known, the retro reflector may be positioned and oriented such that at least two of the diffracted beams pass through a substantial similar disturbance. In that case, the diffracted beams may undergo a phase-shift. However, this may not cause a measurement error, because the phase-shifts are similar in magnitude and sign for each of the different diffracted beams, so the phase-shift is cancelled when the diffracted beams are combined in the second beam. This way, the negative influence of disturbances on the measurement accuracy is reduced.

The further grating described above may be between the grating and the at least one retro reflector. The grating may have a first pitch, i.e., a size of a recurring feature on a grating. The further grating may have a second pitch that is different from the first pitch. The further grating may be used to direct diffraction beams that are not used for displacement measurement, away from the sensor.

In an embodiment the first beam is diffracted at the grating 1 into diffracted beams. The diffracted beams comprise a first measurement beam and a second measurement beam. The first measurement is used for determining a first displacement, e.g., a first x-translation, as described above. However, the first measurement beam may be sensitive to a rotation along the length of the grating, e.g., y-direction, with the rotational axis at the grating. It may be desirable to distinguish between the x-translation and the rotation. To make this distinction, the second measurement beam is diffracted by the further grating. This diffracted second measurement beam is then used similar to the first measurement beam, except that the further grating is now used as if it is the grating. Because of this, the diffracted measurement beam may be sensitive to a rotation along the length of the further grating, e.g., y-direction, with the rotational axis at the further grating. As the grating and further grating are at different locations, so are the rotational axes. Now it is possible to determine the displacement and the rotation by adding and subtracting the measured values of the first and second measurement beams.

Figure 4:
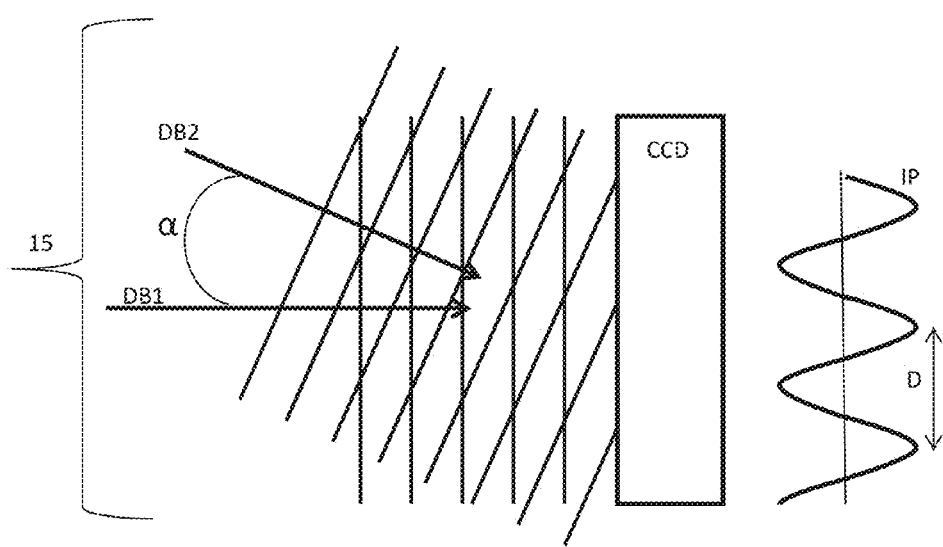
FIG. 4 depicts a sensor for a displacement measurement system according to the invention.

The sensor may comprise a CCD-sensor, CCD. The displacement measurement system may be arranged to project the second beam onto the CCD-sensor, wherein the second beam has a sine-shaped intensity across the CCD-sensor, see FIG. 4. The second beam comprises two diffracted beams, DB1 and DB2. The direction of the beams is indicated with the arrows. The lightwaves of the diffracted beams DB1 and DB2 are indicated with lines perpendicular to the arrows. There is an angle α between diffracted beams DB1 and DB2. When the diffracted beams DB1 and DB2 are incident on the CCD-sensor, the diffracted beams create a sine-shaped interference pattern IP, which is represented in FIG. 3. The interference pattern IP causes high light intensity on some parts of the CCD-sensor and low intensity on other parts. A translation of the sine-shape on the CCD-sensor indicates a difference in phase between the diffracted beams DB1 and DB2. This may be a caused by a translation. A change in the spatial wavelength D of the sine-shape indicates a change in angel α. This may be caused by a tilt, hence a tilt may be measured by the displacement measurement system.

The lithographic apparatus disclosed above may have the displacement measurement system disclosed above. The displacement measurement system may be arranged to measure a displacement of one of the support and substrate table.

The support may comprise a long-stroke module for coarse positioning of the patterning device. The support may further comprise a short-stroke module for fine positioning of the patterning device. The first grating may be on one of the short-stroke and long-stroke modules and the at least one retro-reflector may be on the other of the short-stroke and long-stroke module. The displacement, which is measured by the displacement measurement system, may be a displacement of the long-stroke module relative to the short-stroke module.

The substrate table may comprise a long-stroke module for coarse positioning of the substrate, and may comprise a short-stroke module for fine positioning of the substrate. The first grating may be on one of the short-stroke and long-stroke modules and the at least one retro-reflector may be on the other of the short-stroke and long-stroke module. The displacement, measured by the displacement measuring system, may be a displacement of the long-stroke module relative to the short-stroke module.

By frequency filtering of the X displacement signal of the sensor it may become possible to differentiate between the phase lead or lag caused by tilt of the second diffractive grating with respect to the first grating or caused by movement of the second refractive grating with respect to the first refractive grating. In this way it becomes possible to measure the RY rotations with the X displacement signal. Similarly the above applies to the Y direction such that the RX rotations may be measured with the Y displacement signal.

The displacement measurement system described above may use a first beam of radiation from a light source that provides the first beam at substantially a single wavelength or frequency. In this case, the first beam of radiation is homogenous.

Alternatively, the light source may provide the first beam at a plurality of wavelengths or frequencies, for example 2 wavelengths. The first beam of radiation may be heterodyne. The wavelengths may differ only a small amount relative to each other, so that when the wavelengths are combined to create the first beam, the combined wavelength is substantially lower than the separate wavelengths. The sensor may be more suitable to receive the combined wavelength with the lower wavelength.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A displacement measurement system, for measuring a displacement of a first beam of radiation, the displacement measurement system comprising:
    a two dimensional reflection grating configured to diffract the first beam of radiation a first time to form at least two diffracted beams;
    at least two retro reflectors configured to redirect the at least two diffracted beams to diffract a second time on the reflection grating;
    wherein the at least two retro reflectors are configured to redirect the at least two diffracted beams to diffract a third time on the reflection grating before the at least two diffracted beams are being recombined to form the second beam;
    wherein the at least two retro reflectors are arranged to redirect the at least two diffraction beams to diffract at least a fourth time on the reflection grating before the at least two diffracted beams are recombined to form the second beam, and
    a sensor configured to receive the second beam and determine the displacement from an intensity of the second beam,
    wherein reflectors of the at least two retro reflectors are positioned only between the reflection grating and the sensor, and
    wherein the at least two diffracted beams comprise information about the displacement in a first and a second direction, and wherein the first direction is different from the second direction.

2. The displacement measurement system according to claim 1, wherein the at least two retro reflectors comprise a corner cube reflector.

3. The displacement measurement system according to claim 1, wherein the at least two retro reflectors comprise a roof top reflector.

4. The displacement measurement system according to claim 1, wherein the at least two retro reflectors comprise a cats eye.

5. The displacement measurement system according to claim 1, wherein the reflection grating is provided in a single plane.

6. The displacement measurement system according to claim 1, wherein the reflection grating and the at least two retro reflectors are positioned on a single body as to measure relative internal displacement or strain.

7. The displacement measurement system according to claim 1, wherein the displacement measurement system comprises an alignment mark.

8. The displacement measurement system according to claim 1, wherein the at least two retro reflectors are arranged relative to the reflection grating to redirect the diffracted beams over paths, each of the path having a similar amount of disturbances.

9. The displacement measurement system according to claim 1, comprising a further grating for further diffracting the diffracted beams, the further grating being between the reflection grating and the at least two retro reflectors, the reflection grating having a first pitch, the further grating having a second pitch different from the first pitch.

10. The displacement measurement system according to claim 1, wherein the sensor comprises a CCD-sensor, wherein the displacement measurement system is arranged to project the second beam onto the CCD-sensor, the second beam having a sine-shaped intensity across the CCD-sensor.

11. The displacement measurement system according to claim 1, wherein the sensor comprises a photodiode.

12. The displacement measurement system of claim 1, wherein a first optical-effect orientation of the first retro reflector is substantially perpendicular to a second optical-effect orientation of the second retro reflector.

13. A lithographic apparatus comprising:
an illumination system configured to condition a first radiation beam;
a support configured to support a patterning device, the patterning device being capable of imparting the radiation beam with a pattern in its cross-section to form a patterned radiation beam;
a substrate table configured to hold a substrate; and
a projection system configured to project the patterned radiation beam onto a target portion of the substrate; and
a displacement measurement system having:
a two dimensional reflection grating configured to diffract a second radiation beam a first time to form at least two diffracted beams,
at least two retro reflectors configured to redirect the at least two diffracted beams to diffract a second time on the reflection grating;
wherein the at least two retro reflectors are configured to redirect the at least two diffracted beams to diffract a third time on the reflection grating before the at least two diffracted beams are recombined to form the second beam;
wherein the at least two retro reflectors are arranged to redirect the at least two diffracted beams to diffract at least a fourth time on the reflection grating before the at least two diffracted beams are recombined to form the second beam;
a sensor configured to receive the second beam and determine the displacement from an intensity of the second beam, and
wherein retro reflectors of the at least two retro reflectors are positioned only between the sensor and the reflection grating,
wherein the at least two diffracted beams comprise information about the displacement in a first and a second direction, and wherein the first direction is different from the second direction.

14. The lithographic apparatus of claim 13, wherein the displacement measurement system is arranged to measure a displacement of one of the support and substrate table.

15. The lithographic apparatus of claim 13, wherein the support comprises a long-stroke module for coarse positioning of the patterning device, and comprises a short-stroke module for fine positioning of the patterning device, wherein the reflection grating is on one of the short-stroke and long-stroke modules and the at least one retro reflector is on the other of the short-stroke and long-stroke module, wherein the displacement is a displacement of the long-stroke module relative to the short-stroke module.

16. The lithographic apparatus of claim 13, wherein the substrate table comprises a long-stroke module for coarse positioning of the substrate, and comprises a short-stroke module for fine positioning of the substrate, wherein the reflection grating is on one of the short-stroke and long-stroke modules and the at least one retro reflector is on the other of the short-stroke and long-stroke module, wherein the displacement is a displacement of the long-stroke module relative to the short-stroke module.

17. A method of measuring a displacement by:
diffracting a first beam of radiation at a two dimensional reflection grating to form a first plurality of beams;
redirecting the first plurality of beams of radiation toward the reflection grating using a first and a second retro-reflectors positioned between a sensor and the reflection grating to form a second plurality of beams of radiation;
redirecting the second plurality of beams of radiation towards the reflection grating using a third and a fourth retro-reflectors positioned between a sensor and the reflection grating to form a recombined beam,
receiving the recombined beam with the sensor; and
determining the displacement from an intensity of the recombined beam,
wherein the first and second pluralities of beams of radiation comprise information about the displacement in a first and a second direction, and wherein the first direction is different from the second direction.

* * * * *